(12) United States Patent
Dalacu

(10) Patent No.: US 6,201,179 B1
(45) Date of Patent: Mar. 13, 2001

(54) ARRAY OF PHOTOVOLTAIC MODULES FOR AN INTEGRATED SOLAR POWER COLLECTOR SYSTEM

(76) Inventor: Nick Dalacu, 108 Aikman Ave., Hamilton, Ontario (CA), L8M 1P9

( * ) Notice: Subject to any disclaimer, the term of this patent is extended or adjusted under 35 U.S.C. 154(b) by 0 days.

(21) Appl. No.: 09/165,031

(22) Filed: Oct. 2, 1998

Related U.S. Application Data

(60) Provisional application No. 60/060,797, filed on Oct. 3, 1997, provisional application No. 60/063,070, filed on Oct. 27, 1997, and provisional application No. 60/067,378, filed on Dec. 3, 1997.

(51) Int. Cl.[7] .................................................. H01L 31/048
(52) U.S. Cl. ........................ 136/244; 136/248; 136/251; 438/66
(58) Field of Search .................................. 136/244, 248, 136/251; 438/66

(56) References Cited

U.S. PATENT DOCUMENTS

| | | | |
|---|---|---|---|
| 4,040,867 | * | 8/1977 | Forestieri ............................. 136/244 |
| 4,636,577 | * | 1/1987 | Peterpaul ............................. 136/206 |
| 4,936,063 | * | 6/1990 | Humphrey ............................. 52/200 |
| 5,164,020 | * | 11/1992 | Wagner et al. ....................... 136/251 |
| 5,289,999 | * | 3/1994 | Naujeck et al. ...................... 244/173 |
| 5,480,494 | * | 1/1996 | Inoue .................................... 136/251 |
| 5,524,401 | * | 6/1996 | Ishikawa et al. ................... 52/173.3 |
| 5,589,006 | * | 12/1996 | Itoyama et al. ...................... 136/248 |
| 5,746,839 | * | 5/1998 | Dinwoodie ........................... 136/251 |
| 5,935,343 | * | 8/1999 | Hollick ................................. 136/246 |

* cited by examiner

Primary Examiner—Bernard Codd

(57) ABSTRACT

An integrated solar power collector system for direct installation on an upholding structure includes a plurality of first array of photovoltaic modules. Each array comprises a substrate, defining a module support area, an anchoring zone, a first interlocking zone and a second interlocking zone on an opposite side of the first substrate from the first interlocking zone. A array also comprises collecting surface with a plurality of photovoltaic modules arranged proximal to each other on the module support area so as to leave a minimal residual space between the modules. The substrates are made of a corrugated material so as to present an increased support for the modules and to provide channels for channels for removing the heat dissipated by the modules. Each array is fixed to an upholding structure along the anchoring zone and the first interlocking zone and is fixed to a neighboring module along the second interlocking zone.

20 Claims, 6 Drawing Sheets

ARRAY OF PHOTOVOLTAIC MODULES FOR AN INTEGRATED SOLAR POWER COLLECTOR SYSTEM

This appln. claims benefit of provisional appln. 60/060,797, Oct. 3, 1997 and Provisional Appln. 60/063,070 Oct. 27, 1997 and provisional appln. 60/067,378 Dec. 3, 1997.

BACKGROUND OF THE INVENTION

1. Field of the Invention

This invention is directed to a solar collector system and in particular to an array of photovoltaic modules for an integrated solar power collector system.

2. Background and Related Art

Photovoltaic devices made of Selenium have been known since the $19^{th}$ century. The silicon solar cell was the first known photovoltaic device that could convert a sufficient amount of sun's energy to power complex electronic circuits.

A photovoltaic cell is a solid-state device in which a junction is formed between adjacent layers of semiconductor materials doped with specific atoms, in order to create an n-type region and a p-type region. The photons incident on the semiconductor dislodge electrons from the valence band. These electrons, collected by the electric field at the junction, create a voltage which can be put at work in an external circuit.

A basic limit on the performance of these devices is that light photons lacking the energy needed to lift electrons from the valence to the conduction bands can not contribute to photovoltaic current, and also the energy transferred to electrons which exceeds the minimum excitation threshold, can not be recovered as useful electric current. Most of the photon energy not recovered as electricity, is converted to thermal energy in the cell. The overall effect is that the efficiency of solar cells does not exceed 16% in commercial devices.

As the energy collected is proportional with the surface exposed to solar radiation, and also in order to accommodate the electrical characteristics of the solar cells, in most application 36 (4×9) photovoltaic cells are grouped in a module, the cells being connected in series. The wires between the cells are arranged inside the module and not accessible. The only accessible connections are the "+" terminal of the first cell in the series and the "−" terminal of the last cell.

A module usually has an area of 1.5'×3' or 4'×2'. Larger modules with an area of 16 square feet are also commercially available. A cell generates approximately 0.5 volts, and as a result, a module generates approximately 20 volts open circuit, giving a short-circuit current of 4 to 6 amperes. Still, the power generated by a module is rather low, a fill factor of only 0.5–0.8 can be obtained, depending on the quality of the cells.

Therefore, many applications use arrays of modules which are connected to each other in accordance with current and voltage requirements of the application. There are also various ways for electrically connecting the modules; in general, the positive and negative poles of all modules are wired to two bus-bars, or are wired with conductors placed in channels specifically provided on the back of the modules.

It is known practice to mount solar modules on rooftops where they are most likely to receive a maximum amount of sunlight without interference from trees or nearby constructions. One method for mounting an array of solar modules on a roof is to first assemble the modules on a base, to form the array, and then to secure the array on the existing rooftop. Special consideration should be given to the wind load, the weight of the snow, and the extra weight of the modules, when designing such a roof-over roof assembly.

Another method for mounting an array on the roof is to mount the solar modules individually directly on the roof. In this case, there are a number of operations which must be performed on the roof, such as installing the modules, interlocking the modules to each other, wiring the modules and treating the surface thus obtained to obtain a weather—resistant roof. The modules are fragile and may break if stepped on. As such, walkways must be provided on the roof, which reduce the surface dedicated to the modules.

A photovoltaic roofing assembly is disclosed in U.S. Pat. No. 5,505,788 (issued to Dinwoodie on Apr. 9, 1996), where the modules are disposed as a layer on top of the roof, and separated therefrom by pre-formed spacers, pedestals or supports. Use of spacers enables heat exchange with a convecting fluid flowing between the modules and the roof. Preferably, the cooling fluid is air or other gaseous fluid, or could also be a liquid. Besides the disadvantages listed above, it is difficult to mount the spacers on the roof and then the modules on the spacers as in the system disclosed by this patent.

There is a need to provide a method for installing an array of photovoltaic modules directly on the roof, which is simple, cost-effective and easy to install.

SUMMARY OF THE INVENTION

It is an object of the invention to provide a solar power collector system which alleviates totally or in part the drawbacks of the prior art photovoltaic systems.

It is another object of the present invention to provide an integrated solar power collector system which uses arrays of photovoltaic modules interlocked to form an integrated collecting surface of a desired size.

Still another object of the present invention is to provide a solar power collector system comprising a plurality of photovoltaic modules installed on a corrugated substrate. The substrate provides enhanced resistance to stress and facilitates temperature control of the modules. As such, the solar power collector system according to the invention acts as a combined electrical current generator and hot air collector.

Still another object of the invention is to provide an integrated solar power collector system which is weather resistant and offers improved resistance to water leakage.

Accordingly, the invention provides an integrated solar power collector system comprising a first array of photovoltaic modules including: a first substrate, defining a module support area, an anchoring zone, a first interlocking zone and a second interlocking zone on an opposite side of the first substrate from the first interlocking zone; and a first collecting surface comprising a plurality of photovoltaic modules arranged proximal to each other on the module support area so as to leave a minimal residual space between the modules.

A second corrugated substrate, supports a second collecting surface comprising a plurality of photovoltaic modules arranged proximal to each other so as to leave a minimal residual space between the modules. Means for interlocking the second interlocking zone of the first array and the first interlocking zone of the second array to each other provide an integral collecting area. The solar power collector system may be installed directly on an upholding structure, such as the roof of a building.

The invention also provides for a method for collecting solar power comprising providing a first array of photovoltaic modules on a first substrate so as to leave a minimal residual space between the modules, the first substrate defining a first collecting surface, an anchoring zone, a first interlocking zone and a second interlocking zone on an opposite side of the first substrate from the first interlocking zone, and fixing the first substrate to an upholding structure along the anchoring zone and the first interlocking zone.

A second array of photovoltaic modules is provided on a second substrate, the second substrate defining a second collecting surface, an anchoring zone, a first interlocking zone and a second interlocking zone on an opposite side of the second substrate from the first interlocking zone. The second substrate is fixed to the upholding structure along the anchoring zone, and the first substrate is fixed to the second substrate and to the upholding structure along the second interlocking zone of the first substrate and the second interlocking zone of the second substrate, to provide an integral collecting area.

Advantageously, the solar power collector system of the invention alleviates the need for individual framing of the modules, resulting in a system that is lighter and less expensive than systems of the prior art.

Another advantage of this invention is that the modules are assembled in arrays at the factory, which results again in cost savings and reduced installation time. The modules may support heavy loads, such as ice and snow, since each is supported along a large portion of its area.

Still another advantage is that the electrical connections between the modules are made on the back of the collecting surface, which is in the attic of the building when the system is installed on the roof. In this way, not only the installation is easier to perform, but also the electrical leads are weather protected.

The collector system according to an embodiment of the invention has the advantage that it can be used to keep in place the roof tresses using simple/common installation methods. The system is advantageously used in areas where wood is the construction material of choice.

Other advantages of the collector system of the invention are that it has a sturdy structure, does not require provision of walkways, it enables temperature regulation under the cells, and the hot air resulting in the process of cooling the cells can be used for heating.

All these advantages result in a longer life of the solar cells and of the system according to the invention, and in a higher collection efficiency.

BRIEF DESCRIPTION OF THE DRAWINGS

Further advantages, features and details of the invention will be apparent from the following description of the preferred embodiments with reference to the drawings, in which.

DESCRIPTION OF THE PREFERRED EMBODIMENT

Figure 1A:
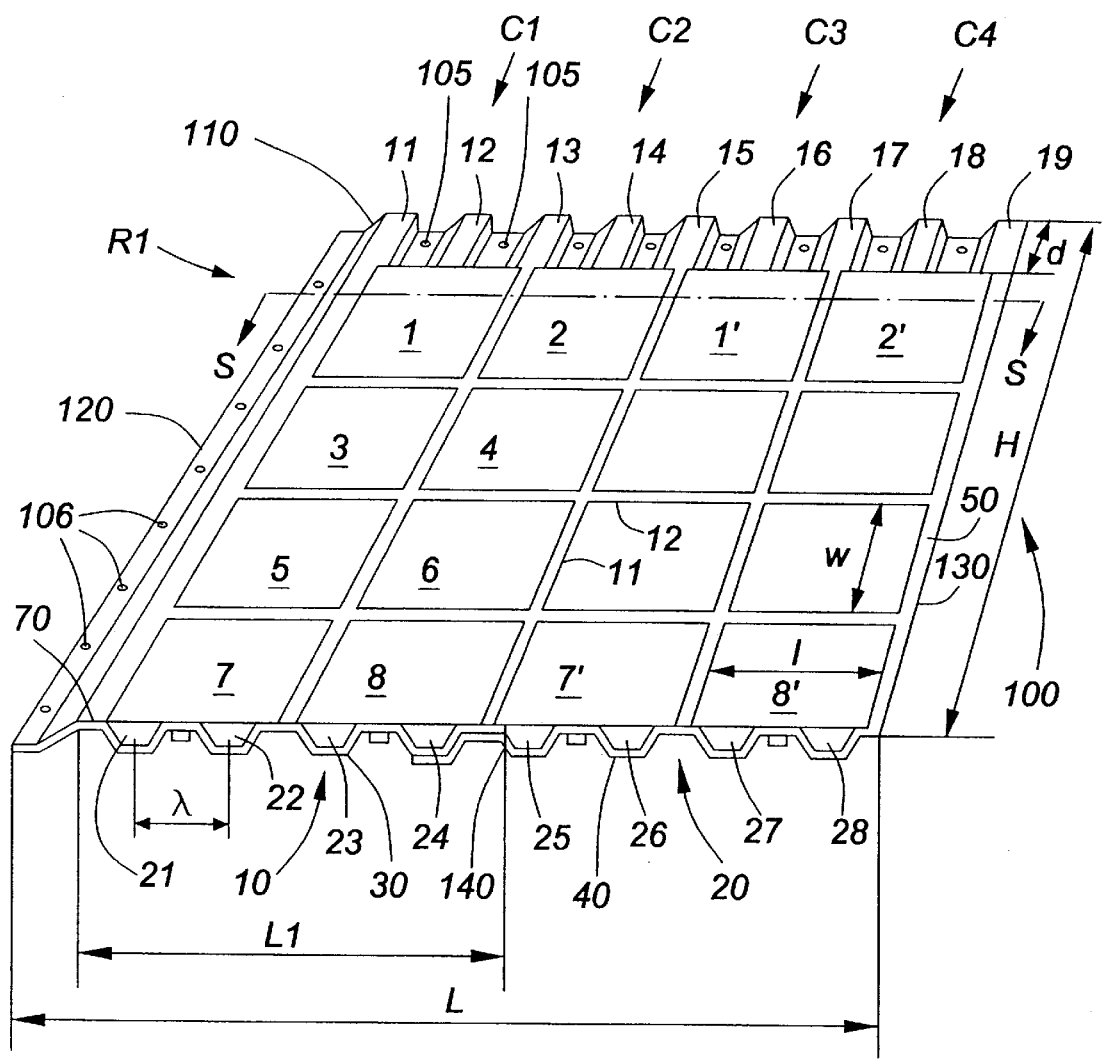
FIG. 1A shows a perspective view of a solar power collector system according to the invention.

FIG. 1A shows a perspective view of a solar power collector system 100 comprising two arrays 10 and 20 of photovoltaic modules according to the invention. Each array 10, 20 of solar power collector system 100 comprises a plurality of photovoltaic modules arranged in rows and columns, and fixed on a respective substrate 30, 40. A column of modules of system 100, such as column C1 comprises modules 1, 3, 5 and 7, whereas a row, such as row R1 comprises modules 1, 2, 1', and 2'. A module is characterized by a length (l) and a width (w); these definitions will be used in the following also for designating sides "/", and respectively "w" of a module.

While solar system 100 illustrated in FIG. 1A has 4×4 modules, it is to be understood that the number of modules of collector system 100 is selected in accordance with the size of the upholding structure to be covered, and on the power necessary for the respective application. The modules and the substrate are selected so as to obtain a maximum area of exposition to sun for the size of the upholding structure on which it is installed.

Array 10 comprises modules 1–8 arranged in rows and columns on substrate 30, while array 20 comprises modules 1'–8' arranged on substrate 40. The corrugations, or ribs, 11 to 19 are illustrated with a trapezoidal profile on FIG. 1A, however other profiles are acceptable, as long as the upper sides of the ribs form a flat surface for providing an as large as possible area of support for the modules. The top face of a rib is denoted here with "i" (see FIG. 2A), which will also be used to define the width of the rib. Channels 21 to 28 are formed between the modules and the respective substrates 30 and 40. The arrays are interlocked to each other in a simple manner, to form the unitary solar power collector system 100.

A plurality of substrates 30, 40 may be fixed to each other to form a base 50 of a desired width H and length "L". Base 50 has a plurality of functions: it supports the modules, it offers a larger cooling surface for the modules than a flat substrate, and also acts as a heat collector.

In the example of FIG. 1A, the modules are arranged with side "w" oriented along ribs 11–19 of base 50. The distance between two adjacent ribs, denoted herein with λ, is in a 2:1 relationship with side "/" of the modules, such that each module is supported by three ribs.

Figure 1B:
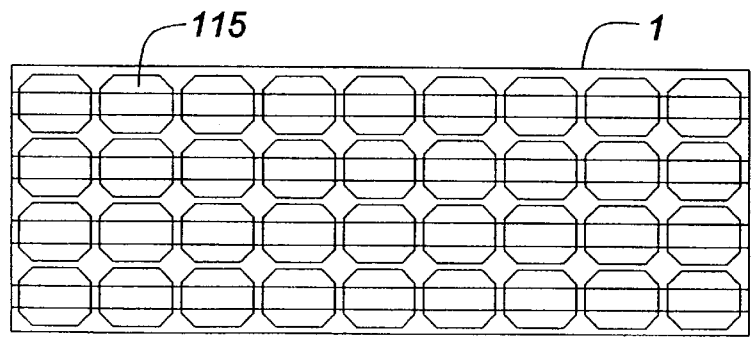
FIG. 1B shows how the photovoltaic cells are arranged in a module.
Figure 1C:
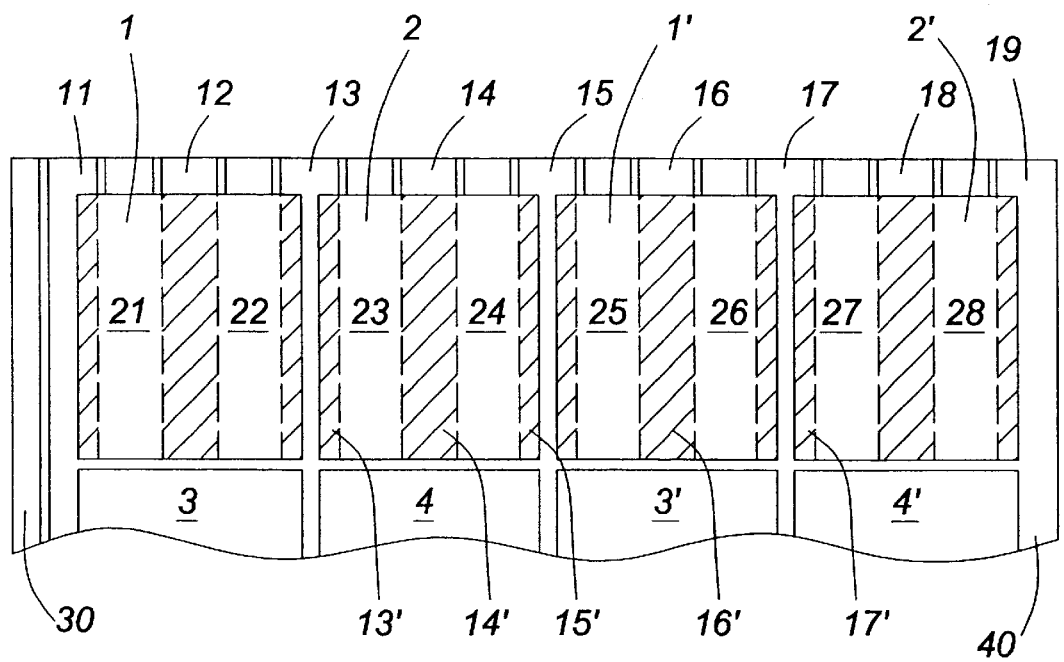
FIG. 1C shows the support area for the modules.
Figure 2A:
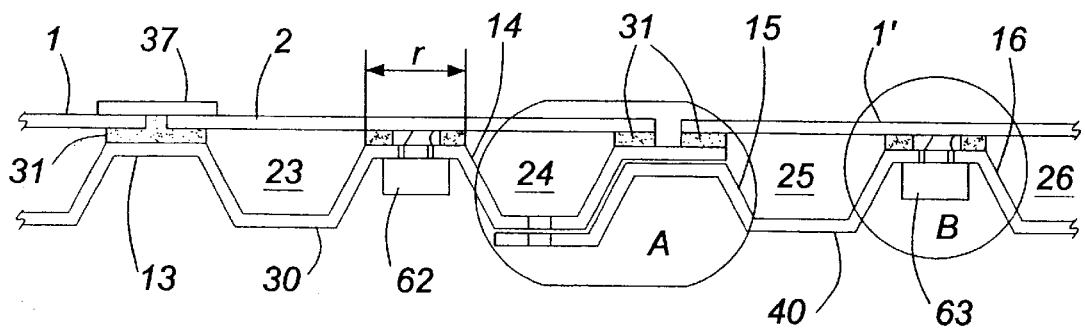
FIG. 2A illustrates a transversal cross-section in the solar system of FIG. 1A, along line S—S.

As also shown in FIGS. 1C and 2A, module 2 is supported in its middle by rib 14 on an area 14' defined by the width "/" of the top face of this rib and the width "w" of the module. As well, module 2 is supported along sides "w" by ribs 13 and 15, on areas 13' and respectively 15', defined by less than ½ of the width of the upper side rib and the width of the module.

For a general case, the ratio "R" between "/" and "λ" should be an integer selected such that a module can be arranged on the substrate with sides "w" supported by half of a rib.

This arrangement results in a sturdy structure, since the modules are supported in the middle, where they may broke easily if not supported. They are also supported along two edges. As such, a person may walk on the roof system without damaging the modules.

FIG. 1C also illustrates channels 21–28 formed under the modules. These channels are used according to this invention for providing a heat exchange between the modules and a flow of cool air that removes the heat generated by the cells and uses the air so heated as need be.

FIG. 1B illustrates a module 1 without the upper cover for showing the photovoltaic cells, designated with reference numeral 115. As indicated above, the modules are off-shelf components. For example, a module that is currently available on the market and can be used for this invention is CANROM-60™ which generates 20.5 V open circuit, has a short-circuit current of 4.6 A, and a rated power of 60 W. The voltage and current at the maximum power point are 16.0 V, and respectively 3.9 A. The size of this module is 21'/46' (53.3/116.8 cm). It is to be understood that other types of modules may be used for this invention, as required by the application.

System 100 is attached to the upholding structure, such as for example to the roof truss of a building, along sides 110, 120 and 130 of base 50. While the attachment along side 130 of the substrate may or may be not always necessary, the upper side 110 should always be used for fixing the system to the upholding structure.

To this end, each substrate 30, 40 is provided with an anchoring zone at the upper side 110. This means that the substrates are cut longer with a distance "d" than the cumulated width of the modules forming a column. For example, width "H" of substrates 30 and 40 in FIG. 1A is 4×(w)+(d) and plus three times the residual distance between the modules. Holes 105 are perforated in the channels between the ribs, and the arrays 10 and 20 are fixed with screws to the upholding structure.

Base 50 is shown in the appended drawing as comprised of two substrates of corrugated material, namely substrates 30 and 40, but it is to be understood that the number of substrates depends on the size of the modules available, the size of the roof, the electrical power necessary for the respective application, and other design parameters, as it is well known to a person of ordinary skill in the art of solar power collectors.

The arrays are interlocked to each other such that the modules from a continuous collecting surface, with minimal residual space in-between. To this end, each substrate is provided with a first and a second interlocking zone on two opposed sides of the respective substrate. Each interlocking zone has the length "H", and a width of approximately λ. As such, width "L1" of corrugated substrate 30 is minimum 4+1 ribs in the example of FIG. 1A, or is minimum "R" times the number of columns of the array plus one rib, in the general case.

Two adjacent substrates are arranged so that the second interlocking zone of the first substrate overlaps with the first interlocking zone of the second substrate. The second interlocking zone of corrugated substrate 30 comprises the portion from the rib 15 to the right, while the first interlocking zone of the second substrate 40 comprises the portion from rib 15 to the left. The substrates are fixed to each other as it will be explained later in further detail.

The first array 10 is also fixed to the upholding structure along the first interlocking zone of substrate 30, which comprises the portion from the rib 11 to the left. To this end, holes 106 are perforated in the first interlocking zone of substrate 30 and array 10 is fixed to the upholding structure with screws.

It is to be understood that other fixing means may be used for fixing the solar power collector system to the upholding structure.

FIG. 1A also illustrates that corrugated substrate 40 extends outwardly from under the modules by half of rib 19, showing a case when an additional array may be attached to the right of array 20. If array 20 is the last, a zone with a length H and a minimum additional width of λ/2+r/2 is provided along side 130. Thus, the last array may also be fixed to the upholding structure on the right side, in a similar manner as is array 10 at its left.

The first and second interlocking zones may be wider that the dimensions suggested above, it is important that they comprise at least a channel, for allowing easy attachment to the upholding structure.

Modules 7, 8, 7' and 8' are flush to substrates 30 and respectively 40 along side 140.

FIG. 2A illustrates a transversal cross-section in the system 100 of FIG. 1A along lines S–S', showing ribs 13 and 14 of substrate 30, rib 15 made by both substrates 30 and 40, and rib 16 of substrate 40. Module 2, supported by ribs 13, 14, and 15, forms with base 50 channels 23 and 24. Module 1', supported by ribs 15, 16 and 17, forms with base 50 channels 25, 26 and 27. Rib 17 and channels 26 and 27 are not illustrated on FIG. 2A, but they are apparent on e.g. FIG. 1C.

The modules are fixed to the respective substrates using a means for fixing, which can be for example a water resistant glue shown at 31. Any other suitable means for fixing may be used, as long as it provides a reliable attachment of modules to the upper side r of the ribs of base 50.

Figure 2B:
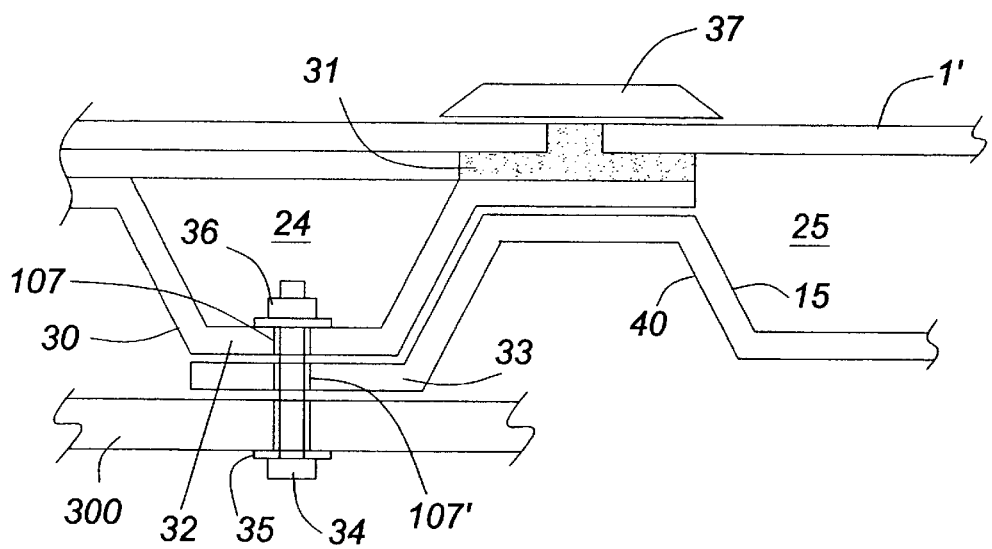
FIG. 2B shows a detail (A) of FIG. 2A, illustrating how two adjacent arrays are assembled to each other.

FIG. 2B shows how substrates 30 and 40 of the respective arrays 10 and 20 are interlocked to each-other (detail A), namely how substrates 30 and 40 are assembled to form base 50. Thus, the second interlocking zone 32 of substrate 30 is arranged to overlap on the first interlocking zone 33 of substrate 40, such that the resulting rib 15 has a cross-section approximately equal to the cross-section of the other ribs. The interlocking zones 32 and 33 are fixed to each other and to the upholding structure 300 using, for example, screws 34 placed through in holes 107 and secured with growers 35 and nuts 36. Holes 107 are provided in zones 32 and 33 at intervals determined by the size and weight of the modules and substrate.

Figure 2C:
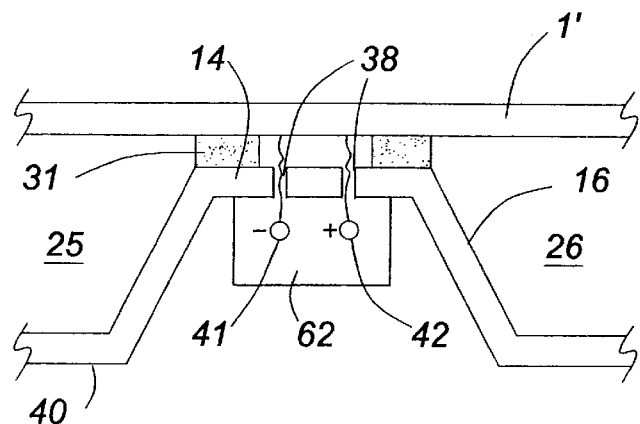
FIG. 2C shows a detail (B) of FIG. 2A, illustrating the electrical connection of the modules.

Also seen on FIG. 2A are the J-boxes 62, and 63 used for connecting the positive and negative poles of modules 2 and respectively 1', while FIG. 2C shows in detail the electrical connections between a module and a corresponding J-box (detail B).

FIG. 2C shows a J-box 62 is fixed under rib 14, that supports the middle section of module 2. Rib 14 has two holes 36, to pass a respective negative terminal 41 and the positive terminal 42 of module 1' to J-box 63. As it is readily understood, the J-box can be accessed from other side of the upholding structure, such as from the attic of the building when system 100 is used as a roof. In this way, the positive and negative terminals from all modules can be connected in series or in parallel, as needed.

By placing the J-boxes inside the building, they are easy accessible for electrical connection and maintenance. In addition, being under the roof, the J-boxes are protected against humidity, penetration of water, wind, etc.

Holes 36 are properly sealed to avoid penetration of the water using any suitable sealant. As well, the space between the modules is sealed with adhesive tape 37 (FIG. 2B), or any other sealing means.

Figure 3:
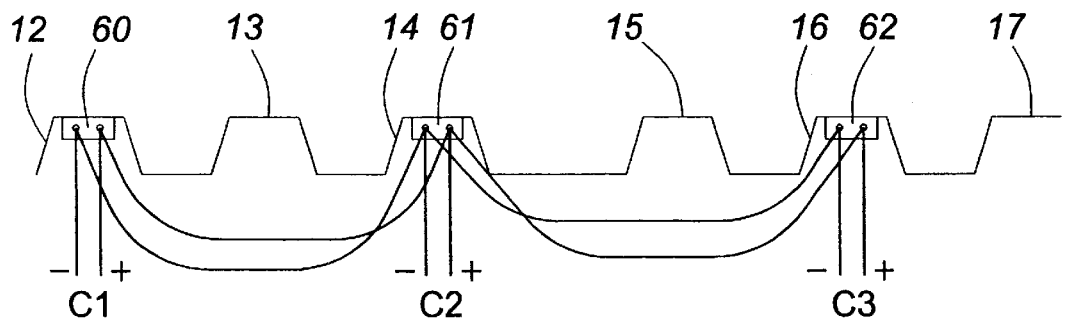
FIG. 3 shows the electrical connections between the arrays.

FIG. 3 illustrates the electrical connection between the J-boxes. For example, all positive poles 42 of J-boxes of column C3 may be connected to each other, to obtain a single positive terminal for column C3. Similarly, all negative poles 41 of J-boxes of column C3 may be connected to each other to obtain a single negative terminal for column C3. Next, all negative and positive terminal of columns C1–C4 may be connected in parallel. However, the columns may be connected in series, as need be. This arrangement results in important economies in wires.

Substrates 30, 40 of base 50 are preferably made of a suitable thermoplastic material such as PVC, for reducing condensation of the moisture inherently present in the air inside the building. The substrates can be vacuum formed with the ribs, channels and interlocking features in place.

In this case, the EVA (Ethylene-Vinyl-Acetate) material which is used for the lamination of the solar panel can be considered as an adhesive for fixing the modules to the substrates. The process of manufacture of a module, such as modules 1–8, comprises applying EVA material on a sheet of glass, then placing the solar cells 115 on the glass with the EVA. The cells are electrically interconnected at the time when they are applied on the glass. Another layer of EVA is laid thereafter on the cells, and the sandwich so formed is covered with a foil of Tedlar®, which is a moisture resistant plastic sheet.

The sandwich is heated up at maximum 100° C. in a laminator, in vacuum, and compressed to eliminate trapped air. Thereafter, the module is maintained for approximately twenty minutes at 100° C., with or without pressure. This cycle cures the EVA material so that it looses its thermoplastic characteristics.

According to the present invention, solar modules 1–8 and 1'–8' are placed on the vacuum formed corrugated substrates 30, 40, before the curing cycle is completed. The modules adhere firmly to the sheet as the curing cycle is completed outside the laminator.

Curing is thus achieved in a simple way, without the need of a laminator. In addition, the operation of adhering the panels to the substrate as a separate step is practically eliminated by this method.

Base 50 may be reinforced with wood ribs placed as necessary. The ribs may be used to additionally facilitate fastening of the panels on the roof.

Figure 4:
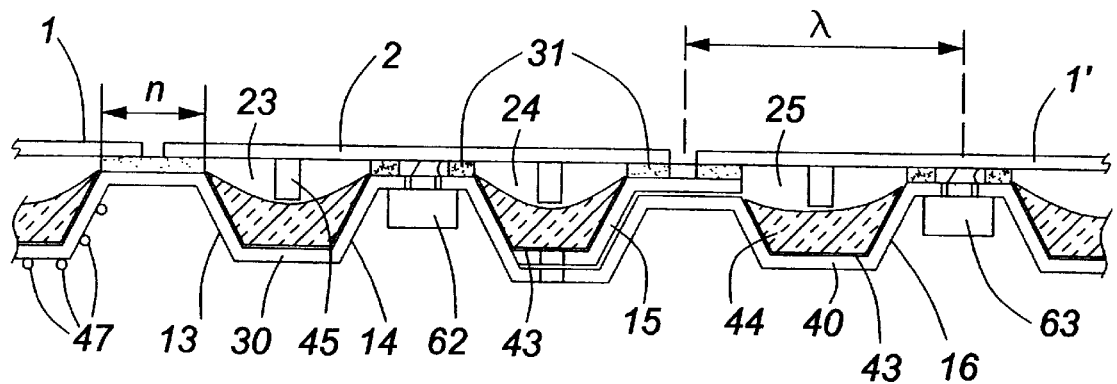
FIG. 4 shows a transversal cross-section in the solar system of FIG. 1A, along line S—S according to another embodiment of the invention.

FIG. 4 illustrates a cross-section along line S—S of FIG. 1 for another embodiment of the invention. This solution was provided for reducing condensation when the system of the invention is used as a solar power collector roof in countries where the temperature drops significantly during winter. Condensation may occur on the underside of the array, as shown at 47, due to the difference between the outside temperature and the temperature inside the building, and also to the rather high level of humidity inside the building.

In this embodiment, the width "r" of the ribs is smaller than the width of the channels. A preferred ratio could be 3:1. A layer of insulating foam 44 is provided in all channels, the foam being attached to the sheets using an adhesive 43. The foam will thermally insulate the sheet for lowering the temperature gradient between the outside and inside faces. A spacer 45 is also provided in all channels for maintaining a space between foam 44 and the respective module for air flow.

It is also to be noted that proper ventilation of the attic may in addition address condensation problem problem.

For houses to be retrofitted with photovoltaic modules on both slopes of the roof, a dome-shaped support 50 may be provided for system 100 to end at the roof level to reduce leakage. The array will appear as part of the roof.

Figure 5:
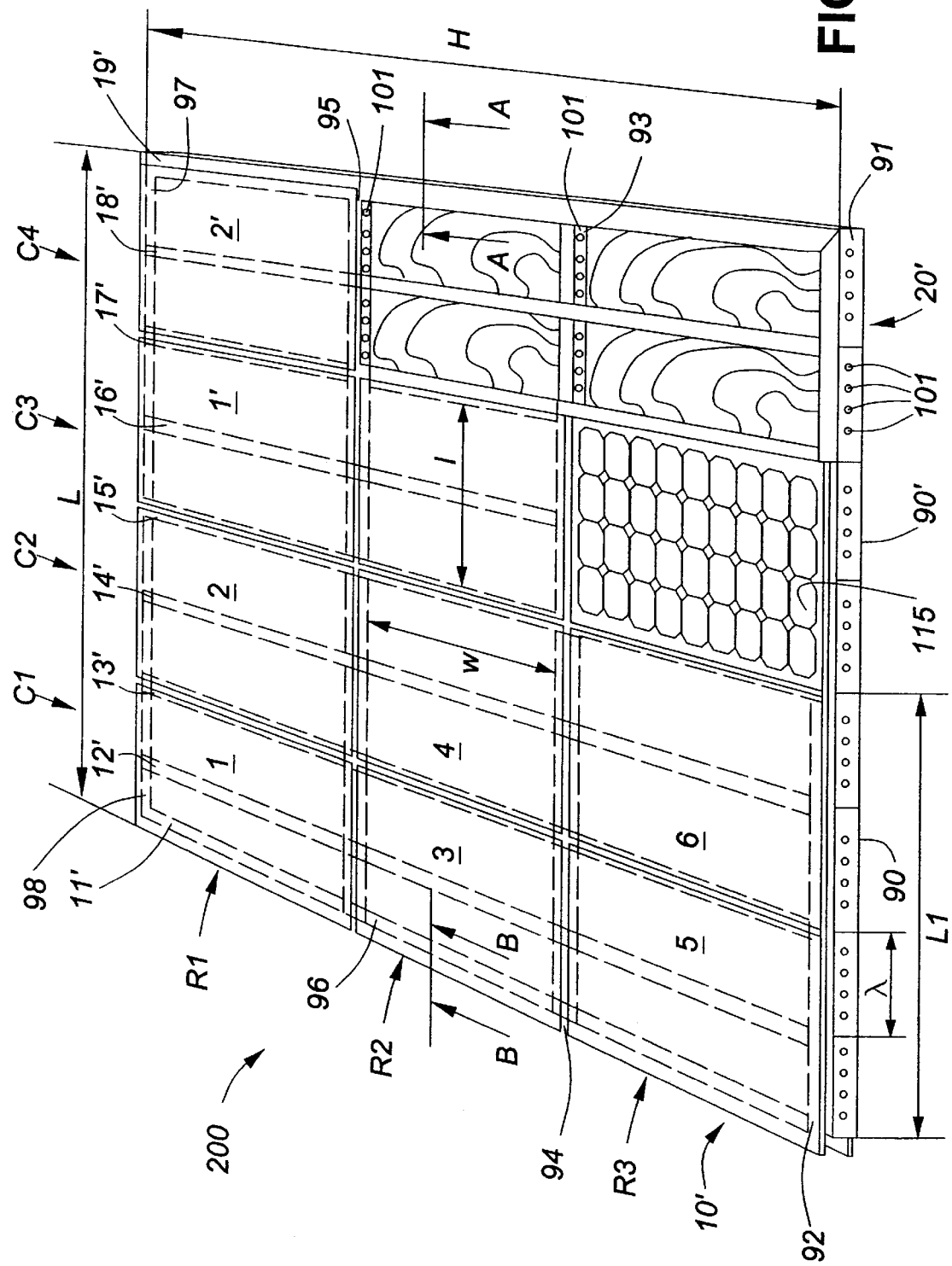
FIG. 5 shows a partially perspective, partially open view of a solar energy collecting surface according to another embodiment of the invention.

FIG. 5 illustrates a perspective view of another embodiment of a solar system used as a collector roof. As indicated above, it is to be understood that the invention may also have other applications. FIG. 5 shows two arrays, array 10' comprising modules 1–6, and array 20' comprising modules 1'–6'. As indicated above, the number of solar modules forming an array can be selected according to the application.

Solar modules 1–6, of array 10' are supported by a wood rafter 30'. Rafter 30' comprises rails 11'–15', arranged parallel to each other at a distance $\lambda$ on a substrate 90. Support beams of a desired length "L" 92, 94, 96, 98 are mounted on same substrate 90 transversal w to the rails. Distance $\lambda$ between the rails is selected in accordance with the width "/" of a solar module, and should not necessarily be constant. The only constraint in connection with the distance between the rails is that rails supporting the lateral side of a module must be arranged at distance "/" from each other and a rail should be placed approximatelyin the middle portion of a module.

It is to be understood that more than one rail may be provided under a module, when larger modules are used. As such, "/" can be a higher multiple of $\lambda$ than shown in FIG. 5. Beams 92, 94, 96, 98, are preferably arranged at a distance "w" from each other, where "w" represents the width of a module. Each beam supports two adjacent modules are supported along the edges by one beam. For example, beam 96 supports modules 1 and 3 along their adjacent sides "/".

Figure 6A:
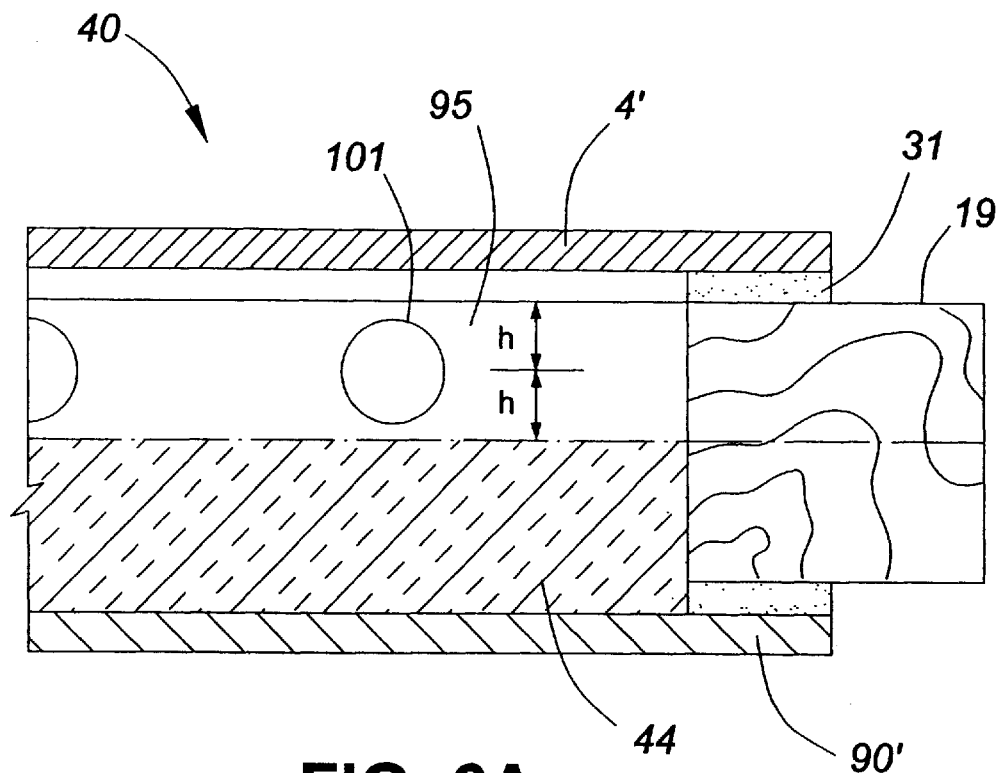
FIG. 6A is a cross-section along lines A—A in FIG. 5.
Figure 6B:
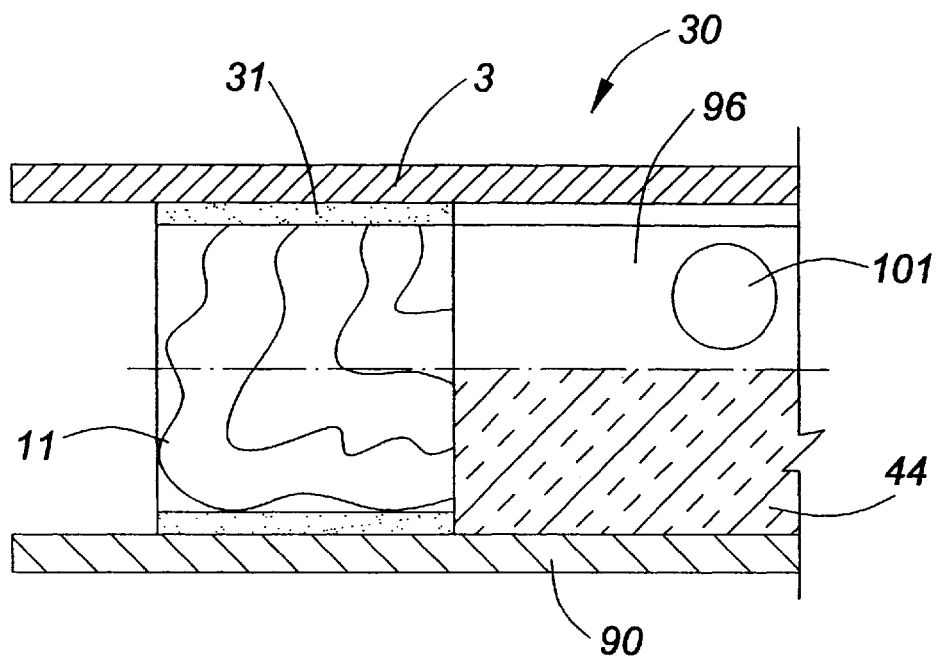
FIG. 6B shows a cross-section along lines B—B in FIG. 5.

The substrate 90, as better seen in FIG. 6B, is formed by a sheet, which can be made of plastic or plywood. The rafters are fixed to the substrate 90 with any suitable adhesive material 31. The material used to encapsulate the solar cells 115 could be used to fix rails 11'–15' to substrate 90 and also to fix the modules 1–6 to the rafters.

As seen in FIG. 6B, module 3 extends outwardly form rail 11' to the left; this enables to extend the collecting surface to the left by adding another array. For the same reason, module 4, for example, is supported along side w by half the width of rail 15'; the other half of rail 15' supports module 3' of array 20.

Similarly, modules 1'–6' of array 20 are supported by a wood rafter made of rails 15', 16' to 19' arranged in parallel to each other at a distance $\lambda$ on a substrate 91. Support beams 91, 93, 95 and 97 are also mounted on substrate 90' transversal to the rails.

The modules are cooled with an air flow that circulates in the channels formed between the module and the rafters, and through holes 101 in the rails 11–19. Holes w 101 are equally disposed in transverse beams 91–98. Holes 101 create passageways for the cooling air to circulate under the solar modules and is subsequently used for heating.

The electrical leads from each panel are passed to the backside of the collecting surface through slots provided in substrate 90, and respectively 90' and connected to terminal strips corresponding to each module.

Figure 7:
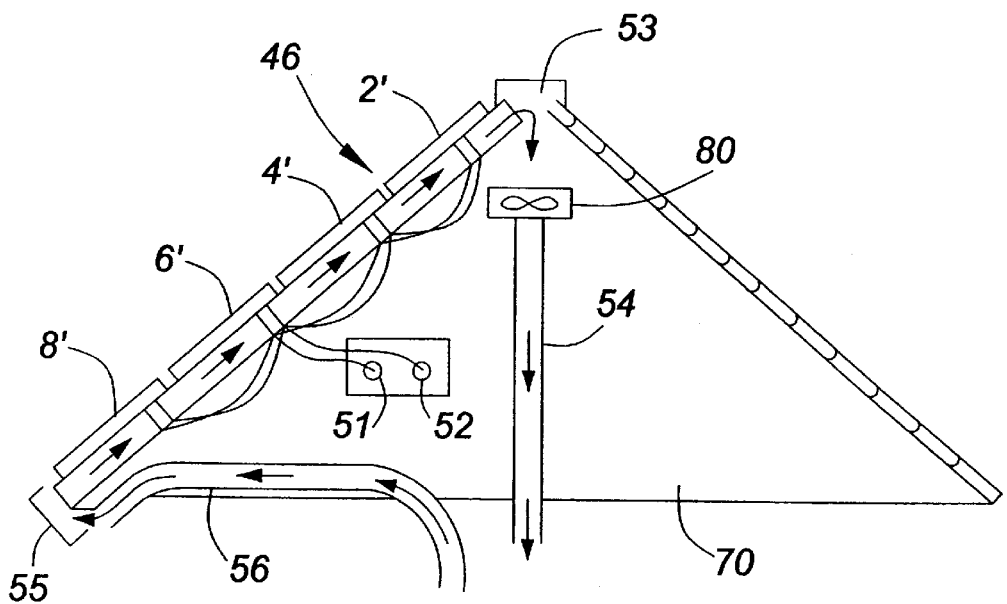
FIG. 7 illustrates the electrical and air circuits for the solar system used as a collector roof.

Channels 21 to 28 formed between base 50 and the modules are conveniently used for cooling the modules, and the heat collected in these channels may be used for heating. FIG. 7 schematically illustrates the electrical and air circuits for the solar system 100 used as a collector roof. The arrays are generally arranged on one side 46 of the roof, namely the side that has southern exposure.

The modules are connected in general in parallel, and to poles 51 and 52 of the entire system are provided in a convenient place in attic 70. The dc current obtained between poles 51 and 52 may be used in any convenient way.

A first air deflector 53 is installed on the top of the roof to direct the hot air exiting channels 21–28 of the solar power collector system 100 towards attic 70. A fan 80 collects the hot air and directs it through conduit 54 to any place of interest, e.g. the heating system of the building. A second air deflector 55 directs the cold air received from conduit 56 into channels 21–28 of the solar power collector system 100.

While the invention has been described with reference to particular example embodiments, further modifications and improvements which will occur to those skilled in the art, may be made within the purview of the appended claims, without departing from the scope of the invention in its broader aspect.

I claim:

1. An integrated solar power collector system for direct installation on an upholding structure including a first array of photovoltaic modules comprising:
    a first substrate with a plurality of ribs separated by channels, said ribs defining a module support area having a substantially rectangular form, said first substrate being provided with an anchoring zone for attaching said first array to the upholding structure, a first interlocking zone and a second interlocking zone on an opposite side of said first substrate from said first interlocking zone, said interlocking zones for fixing said first array to a neighbouring array; and
    a first collecting surface comprising a plurality of photovoltaic modules arranged proximal to each other on said module support area so as to leave a minimal residual space between said modules.

2. A system as claimed in claim 1, further comprising first means for fixing said first ray to the upholding structure along said anchoring zone and said first interlocking zone.

3. A system as claimed in claim 2, wherein said first means for fixing comprises a plurality of holes provided in said anchoring zone; and a like plurality of screws for fixing said respective zone to the upholding structure.

4. A system as claimed in claim 3, wherein said first means for fixing further comprises:
    a plurality of holes provided in said first interlocking zone; and
    a like plurality of screws for fixing said first interlocking zone to the upholding structure.

5. A system as claimed in claim 1, further including a second array of photovoltaic modules, comprising:
    a second substrate with a plurality of ribs separated by channels, said ribs defining a module support area having a substantially rectangular forms said first substrate being provided with an anchoring zone for attaching said second array to the upholding structure, a first interlocking zone and a second interlocking zone on an opposite side of said second substrate from said first interlocking zone, said interlocking zones for fixing said second array to a neighbouring array;
    a second collecting surface comprising a plurality of photovoltaic modules arranged proximal to each other on said module support area so as to leave a minimal residual space between said modules; and
    means for interlocking said second interlocking zone of said first array and said first interlocking zone of said second array to each other and to the upholding structure to provide an integral collecting area.

6. A system as claimed in claim 5, further comprising means for sealing the residual between said modules to weatherproof said integral collecting area.

7. A system as claimed in claim 6, further comprising means for forcing a fluid from a heating system through said channels for removing the heat dissipated by said modules; and means for collecting the fluid carrying the heat dissipated by said modules and forcing it into the heating system.

8. A system as claimed in claim 5, wherein said means for interlocking comprises:
    a plurality of holes provided in said second interlocking zone of said first array and said first interlocking zone of said second array;
    a like plurality of nuts, each fixed about a corresponding hole of said first interlocking zone; and
    a like plurality of screws, each for engaging a corresponding nut for fixing said first and second arrays to each other and to the upholding structure.

9. A system as claimed in claim 1, wherein the distance between two adjacent ribs is "$\lambda$" and the width of the top side of a rib is "r".

10. A system as claimed in claim 9, wherein said modules are arranged with a first side perpendicular to said ribs, and the maximum value for "$\lambda$" is half of the length "l" of said first side.

11. A system as claimed in claim 9, wherein each of said first and said second interlocking zones has a width approximately "$\lambda$" and a length equal to the length of said horizontal side.

12. A system as claimed in claim 9, further comprising:
    a plurality of J-boxes, a J-box associated with a module and mounted on an underside of a rib for receiving the negative and positive terminals of said module; and
    wire means for connecting all said J-boxes in parallel and in series, according to a voltage and current provisioned for said system.

13. A system as claimed in claim 1, wherein said anchoring zone has a width "d" extending from under the module support area.

14. A system as claimed in claim 1, wherein each said module is attached to said first substratwith a weather-resistant glue.

15. A system as claimed in claim 1, further comprising condensation control means for reducing the difference between the temperature of the corrugated substrate and the temperature inside a building, when said system is used as a power collector roof.

16. A system as claimed in claim 1 wherein said substrate comprises a rafter including a plurality of parallel rails and a plurality of parallel beams arranged transversal to said rails.

17. A system as claimed in claim 16, wherein each said module has an area l×w wand said rails are arranged to support each said module at least along sides w and said beams are arranged to support each said module along sides l.

18. A method for collecting solar power comprising:

providing a first array of photovoltaic modules including a first substrate with a plurality of ribs separated by channels, said ribs for supporting a plurality of photovoltaic modules said first array defining a first collecting surface, an anchoring zone for attaching said first array to an upholding structure, a first interlocking zone and a second interlocking zone on an opposite side of said first substrate from said first interlocking zonesaid interlocking zones for fixing said second array to a neighbouring array; and fixing said first substrate directly to the upholding structure along said anchoring zone and said first interlocking zone, wherein said modules are supported by at least three ribs, and are arranged on said substrate so as to leave a minimal residual space.

19. A method as claimed in claim 18, further comprising the steps of:

providing a second array of photovoltaic modules attached on a second substrate so as to leave a minimal residual space between said modules, said second substrate defining a second collecting surface, an anchoring zone, a first interlocking zone and a second interlocking zone on an opposite side of said second substrate from said first interlocking zone;

fixing said second substrate to the upholding structure along said anchoring zone; and fixing said first substrate to said second substrate and to the upholding structure along said second interlocking zone of said first substrate and said second interlocking zone of said second substrate to provide an integral collecting area.

20. A method as claimed in claim 18, wherein said step of providing comprises:

providing a sheet of glass of an area selected to support a plurality of solar cells;

applying a first layer of an adhesive material on said sheet of glass;

placing said plurality of solar cells adjacent to each other on said adhesive material, such as to cover the entire area of said sheet of glass;

applying a second layer of said adhesive material on said sheet of glass;

placing a foil of a moisture resistant plastic over said second layer to form a sandwich;

heating said sandwich in vacuum at a first temperature and a first pressure to eliminate trapped air from said sandwich;

heating said sandwich at a second temperature for a first time less than the time needed for curing said adhesive material; and placing said sandwich on a thermoplastic substrate and heating said sandwich for a second time until curing said adhesive material.

* * * * *